United States Patent
Drew et al.

(10) Patent No.: US 9,398,710 B2
(45) Date of Patent: Jul. 19, 2016

(54) ENCLOSURE FOR AN ELECTRONIC CONTROL UNIT AND ELECTRONIC CONTROL UNIT

(71) Applicant: CONTINENTAL AUTOMOTIVE GMBH, Hannover (DE)

(72) Inventors: Gregory Drew, Zeitlarn (DE); Hermann Haemmerl, Ergolding (DE); Bernd Roller, Regensburg (DE); James G. Godwin, Ferndale, MI (US)

(73) Assignee: Continental Automotive GmbH, Hannover (DE)

( * ) Notice: Subject to any disclaimer, the term of this patent is extended or adjusted under 35 U.S.C. 154(b) by 71 days.

(21) Appl. No.: 14/453,798

(22) Filed: Aug. 7, 2014

(65) Prior Publication Data

US 2016/0044814 A1 Feb. 11, 2016

(51) Int. Cl.
| | |
|---|---|
| *H05K 5/06* | (2006.01) |
| *H05K 5/00* | (2006.01) |
| *H05K 5/02* | (2006.01) |
| *H05K 5/03* | (2006.01) |
| *H05K 7/14* | (2006.01) |

(52) U.S. Cl.
CPC ............. *H05K 5/069* (2013.01); *H05K 5/0004* (2013.01); *H05K 5/0213* (2013.01); *H05K 5/0217* (2013.01); *H05K 5/03* (2013.01); *H05K 7/1427* (2013.01)

(58) Field of Classification Search
CPC .............................. H05K 5/069; H05K 5/0213
USPC ............... 361/679.01; 174/50, 50.5; 137/171, 137/197, 198
See application file for complete search history.

(56) References Cited

U.S. PATENT DOCUMENTS

| | | | | |
|---|---|---|---|---|
| 2,604,507 A | * | 7/1952 | Tyson ................... | H02G 3/088 174/367 |
| 3,326,230 A | * | 6/1967 | Ulrich ..................... | F16K 24/04 137/199 |
| 3,617,610 A | * | 11/1971 | Katayama et al. ....... | H05K 7/02 174/50 |
| 4,000,447 A | * | 12/1976 | Codrino ............... | H01H 85/046 361/642 |
| 4,066,837 A | * | 1/1978 | Miura .................. | H05K 9/0073 174/366 |
| 4,091,232 A | * | 5/1978 | Lenk ..................... | H05K 7/1417 174/544 |
| 4,313,025 A | * | 1/1982 | Grube, Jr. ................ | H05K 5/03 165/135 |
| 5,276,279 A | * | 1/1994 | Brownlie ................. | H02G 3/10 174/50 |
| 6,297,448 B1 | | 10/2001 | Hara | |
| 7,295,440 B2 | * | 11/2007 | Ganev ................ | H05K 7/20927 165/80.4 |
| 7,492,597 B2 | * | 2/2009 | Huang .................. | H02M 7/003 361/690 |

(Continued)

FOREIGN PATENT DOCUMENTS

| | | |
|---|---|---|
| DE | 102007063191 A1 | 6/2009 |
| DE | 102011078729 A1 | 1/2013 |

(Continued)

*Primary Examiner* — Adrian S Wilson
(74) *Attorney, Agent, or Firm* — Laurence A. Greenberg; Werner H. Stemer; Ralph E. Locher

(57) ABSTRACT

An enclosure for an electronic control unit is specified which contains a rigid housing element for receiving electronic components of the electronic control unit, an elastic cover covering an open side of the housing element and a protrusion element attached to or comprised by the rigid housing element. The cover abuts the protrusion element with a predetermined force when barometric pressures on different sides of the cover are equal. The cover contains an aperture in the region where the cover abuts the protrusion element. Further, an electronic control unit with the enclosure is specified.

13 Claims, 4 Drawing Sheets

(56) References Cited

U.S. PATENT DOCUMENTS

| | | | |
|---|---|---|---|
| 7,601,912 B2* | 10/2009 | Tseng | H05K 5/03 174/50 |
| 7,667,973 B2* | 2/2010 | Shinoda | H05K 5/0047 174/50 |
| 7,838,768 B2* | 11/2010 | Zadach | H05K 5/0213 174/17 VA |
| 8,681,507 B2* | 3/2014 | Hassler | H04B 1/082 174/350 |
| 2002/0090506 A1* | 7/2002 | Protzner | C25D 5/56 428/334 |
| 2003/0094101 A1* | 5/2003 | Hara | B29C 66/71 96/4 |
| 2008/0074840 A1 | 3/2008 | Suzuki | |
| 2009/0109618 A1* | 4/2009 | Yano | H05K 5/068 361/694 |
| 2010/0024898 A1* | 2/2010 | Bansal | B01D 67/0088 137/197 |
| 2010/0128433 A1* | 5/2010 | Harwood | H05K 7/20545 361/690 |
| 2011/0247952 A1* | 10/2011 | Hebach | H05K 5/0213 206/320 |
| 2011/0310536 A1* | 12/2011 | Uttermann | H05K 5/0234 361/679.01 |
| 2012/0067610 A1* | 3/2012 | Stonebraker | H02G 3/081 174/50 |
| 2013/0180437 A1* | 7/2013 | Wilcox | B65D 7/24 108/56.3 |
| 2014/0318374 A1* | 10/2014 | Yano | F21V 31/03 96/11 |

FOREIGN PATENT DOCUMENTS

| | | |
|---|---|---|
| EP | 2036413 A1 | 3/2009 |
| WO | 2008004862 A1 | 1/2008 |
| WO | 2009080158 A1 | 7/2009 |

* cited by examiner

ENCLOSURE FOR AN ELECTRONIC CONTROL UNIT AND ELECTRONIC CONTROL UNIT

BACKGROUND OF THE INVENTION

Field of the Invention

The present disclosure concerns an enclosure for an electronic control unit. More specifically, present invention concerns a technique for managing pressure inside the enclosure.

An electronic control unit (ECU) is adapted for use on board of a motor vehicle. The electronic components of the ECU are disposed inside an enclosure to be protected from harsh environmental conditions such as moisture, dust or aggressive substances. After the components are placed inside the enclosure and the enclosure is sealed, a change of atmospheric pressure outside or inside the enclosure may lead to a pressure difference acting upon the enclosure.

If no pressure relief element is foreseen, big surfaces and large pressure differences may lead to considerable forces acting upon the enclosure. The enclosure may be plastically deformed and a seal of the enclosure may be cyclically fatigued to the point of failure where the enclosure is unable to protect the ECU appropriately.

In one option, the enclosure is constructed stable enough to withstand the pressure difference. However, this may require extremely rigid structures for the enclosure and production cost for the enclosure may be increased. According to another option, the enclosure contains an aperture for venting to achieve compensation of the pressure difference.

To prevent a liquid from entering the enclosure through the aperture, the aperture may be covered by a pressure relief membrane. The pressure relief membrane may for instance be made from PTFE and be especially suited for holding back water while permitting gaseous substances to pass. However, pressure compensation is usually required once per duty cycle of the ECU as the ECU will get warm during operation and thus pressure inside the enclosure will rise. Especially if the ECU is installed on board of a motor vehicle, a large number of pressure relief processes may be required over time. The membrane may fail or permit moist air to enter the enclosure so that over time, liquid water may condense inside the enclosure. Although the water may be non-conductive it may still cause accelerated aging or malfunction of the ECU. It may also cause or promote corrosion of the ECU or the enclosure.

SUMMARY OF THE INVENTION

It is an object of the present invention to provide an enclosure for an electronic control unit that facilitates improved pressure compensation and/or particularly reliable function of the ECU. The invention solves the given object by an enclosure with the features of the independent claim. Dependent claims give preferred embodiments.

An enclosure for an electronic control unit (ECU) is specified. The enclosure is in particular a housing of an ECU. According to a further aspect, an electronic control unit is specified which contains the enclosure. The ECU is for example an engine control unit for an internal combustion engine of a vehicle. The electronic control unit preferably further contains a plurality of electronic components which are in particular arranged on at least one circuit board. The electronic components, in particular the circuit board(s) with the electronic components are preferably received in an interior of the enclosure, i.e. in particular in a cavity of the housing.

The enclosure contains a rigid housing element for receiving the electronic components of the electronic control unit, in particular the circuit board(s) with the electronic components. The housing element is open on one side, i.e. the housing element has in particular an opening. Preferably, the housing element defines the cavity of the housing and the cavity extends into the housing element from the opening. For example, the housing element is configured to receive the electronic components through the opening during assembly of the ECU. In particular, the circuit board(s) is/are inserted into the cavity through the opening during assembly of the ECU. The rigid housing element may be composed from a plurality of parts, for example from a shell part and a connector part. The connector part preferably contains at least one electrical connector for electrical contact making to the electronic components from the outside of the enclosure. The rigid housing element or at least the shell part of the rigid housing element is made from a metal or alloy or from plastic; it is a molded part in one embodiment.

The enclosure further contains an elastic cover covering the open side of the housing element. The elastic cover is in particular positioned to cover the opening and has a sealing rim which surrounds the opening in top view on the opening, the sealing rim being fixedly connected to the rigid housing part. The elastic cover thus in particular closes the cavity which is defined by the rigid housing element as a lid. The cover is, for example, made from a sheet metal. The elastic cover has an aperture for enabling gas flow, e.g. air flow, from the cavity to the outside of the enclosure.

The enclosure furthermore contains a protrusion element which is attached to or comprised by the rigid housing element. In one embodiment, the protrusion element is in one piece with the housing element, e.g. comprised by the same molded part. In one embodiment, the protrusion element protrudes from a bottom plate, opposite of the opening, of the housing element towards the opening. In another embodiment, the enclosure contains a lid part between the bottom plate and the elastic cover, the lid part containing the protrusion element and being in particular positionally fixed relative to the rigid housing element. The lid part may expediently be perforated so that it is inoperable to seal the cavity. The protrusion element may, for example, be in the shape of a post or pin. In one embodiment, the protruding element projects beyond the opening in a direction away from the bottom plate.

The cover abuts the protrusion element with a predetermined force when barometric pressures on different sides of the cover are equal. In other words, the protrusion element is shaped and positioned to deflect the elastic cover from an idle state. In this way, the elastic cover is elastically deformed so that a predetermined spring force is generated which presses the cover against the protrusion element at least when the barometric pressures in the cavity and outside of the enclosure are equal. The aperture of the cover is positioned in a region where the cover abuts the protrusion element. Expediently, the aperture may be sealed by the protrusion element when the cover abuts the protrusion element. In this way, the cavity may expediently be air tightly sealed, in particular by the housing element, the cover and the protrusion element.

Preferably, the cover is deflectable—i.e. elastically deformable—by an overpressure in the interior of the enclosure—i.e. in particular in the cavity—in such fashion that it lifts off from the protrusion element for unsealing the aperture. In other words, when the barometric pressure in the cavity exceeds the barometric pressure outside of the enclosure by a predetermined amount, the elastic cover is elastically deformed so that a gap is established between the cover and the protrusion element and the aperture is unsealed to enable gas flow from the cavity to the outside.

The elastic cover with the aperture abutting the protrusion element may in this way advantageously represent a unidirectional valve that opens when the barometric pressure inside the enclosure exceeds the barometric pressure on the outside by a predetermined amount which is proportional to the predetermined force. The predetermined force may thus be chosen in relationship to a desired pressure difference for venting the enclosure.

After the overpressure is relieved from the inside of the enclosure, the valve closes again and seals the cavity with the electronic components inside the enclosure again. When pressure on the outside of the enclosure exceeds that on the inside, the valve is closed even more firmly so that no air from the outside may enter the enclosure through the aperture. The risk of taking over of humid air into the enclosure may thus be particularly small. As a result, moisture may not accumulate on the inside of the enclosure and corrosion of the electronic control unit or elements of the enclosure may be prevented.

As the elastic cover is mechanically stressed in the same direction most of the time, possible fatigue of the elastic cover may not be an issue. The subject enclosure requires only few elements, some of which may be standard parts. The housing element or the shell part thereof may for example be made from cast or die cast metal and producing the housing element may require a particularly small amount of material as no large barometric forces need to be absorbed. Production costs associated with the housing element may thus be particularly small.

It is preferred that the predetermined force is chosen such that a predetermined lift of the cover in the area of the aperture causes the cover to deform non-plastically. In order to generate the predetermined force, the cover may be deformed like a spring. Deformation characteristics of the elastic cover may comprise an elastic region, followed by a region of plastic deformation when higher forces are used. By keeping the deformation small enough to remain in the elastic region, the cover may maintain the predetermined force over a long operation time. Long time air tightness of the enclosure may thus be ascertained.

According to another preferred embodiment, the protrusion element contains an elastic sealing element which abuts the cover for sealing the aperture. The sealing element may help to prevent air from seeping through the aperture when the barometric pressure outside the enclosure is higher than inside. In another embodiment, elastic sealing material is provided between the sealing rim of the cover and the rigid housing.

The aperture may be spaced apart from an area where the cover mates with the housing element—i.e. in particular from the sealing rim. In particular the aperture may be spaced apart from an area where the cover mates with the housing element by no less than a predetermined distance. For example, the distance of the aperture from the sealing rim is at least 22%, preferably 40%, of the smallest cross section of the opening.

Elasticity of the cover in the area of the aperture may thus be guaranteed. The opening and closing motion of the valve that contains the cover with the aperture and the protrusion element may be eased. The arrangement of the protrusion element, for instance somewhere near the middle of the enclosure, may also help to sustain the cover, especially when the barometric pressure on the outside exceeds that on the inside.

In one embodiment, the aperture is located in a position from which a distance to the area where the cover mates with the housing element—i.e. in particular from the sealing rim—is maximized in all directions. For example, the aperture overlaps with the geometric center of the elastic cover in top view on the opening. This position may be also denoted as a central position. It may additionally or alternatively comprise a geometric center of the housing element in top view on the opening. When the barometric pressure inside the enclosure is large enough to lift the cover from the protrusion element, lifting may be directed perpendicular to the cover in an area of the aperture. Given the predetermined distance from the mounting portion of the cover, lifting may occur in parallel to the direction of the aperture. Opening and closing the aperture for pressure exchange may thus be more reproducible. In addition, the deformation of the cover in the region of the sealing rim may be particularly small in this way so that the risk for damaging the seal between the sealing rim and the housing element due to repeated deflections of the cover is particularly small.

The enclosure may also contains fastening devices for fixing the cover to the housing element. For example, the cover has clamp portions adjacent to the sealing rim, in particular laterally outside of the sealing rim. The clamp portions may press the sealing rim against the housing element. In another embodiment, the enclosure contains clamp elements separate from the cover for pressing the sealing rim against the housing element and/or for positionally fixing the cover relative to the housing element.

In one embodiment, the cover is pressed against the housing element by the fastening device with a force that exceeds the above described predetermined force by no less than a predetermined amount. Load on the fastening device may thus be limited to the predetermined force plus the predetermined amount. Larger forces may not be required, so that the fastening device may be easy to manufacture and to operate. Durability of the fastening device and/or the cover may be improved.

The cover may be stamped in an area around the aperture such as to increase an elastic deformability in the area of the aperture. The stamping may especially be circumferential to the aperture. Opening the valve for venting and closing afterwards may thus be alleviated.

The cover may be formed such that the aperture lies further outwards the housing element than an area where the cover mates with the housing element. In other words, the distance between the sealing rim and the bottom plate is smaller than the distance between the aperture and the bottom plate. This way, a certain slope from the aperture towards a perimeter of the cover may be affected. The slope may help drive liquid water away from the aperture.

According to another embodiment, the cover has a convex shape in the area of the aperture. The convex shape may imply a concave shape on the inside of the enclosure. In other words, the aperture may be comprised by a dome-shaped region of the cover, the apex of the dome-shape being in particular directed away from the bottom plate so that the dome-shape is open towards the bottom plate. The shape may be easily generated by stamping the cover. The convex shape may help to keep moisture and liquids on the outside of the enclosure away from the aperture. Further, the dome-shape may be advantageous for centering the aperture relative to the protrusion element.

In another preferred embodiment, the cover contains a depression surrounding the aperture, the depression in particular extends circumferentially around the convex shaped area of the cover. The depression may have a truncated cone shape in one embodiment. In one development, a circumferential edge of the truncated cone shape merges with the base of the dome-shape. Moisture, dust or dirt may be trapped in the depression so that it is less likely that it finds a way through the aperture.

Advantageous embodiments and developments of the enclosure and the ECU will become apparent from the exemplary embodiments described below in association with the figures.

Other features which are considered as characteristic for the invention are set forth in the appended claims.

Although the invention is illustrated and described herein as embodied in an enclosure for an electronic control unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

In the exemplary embodiments and figures, identical, similar or similarly acting constituent parts are provided with the same reference symbols. In some figures, individual reference symbols may be omitted to improve the clarity of the figures. The elements illustrated in the figures and their size relationships among one another should not be regarded as true to scale. Rather, individual elements may be represented with an exaggerated size for the sake of better representability and/or for the sake of better understanding.

Figure 1:
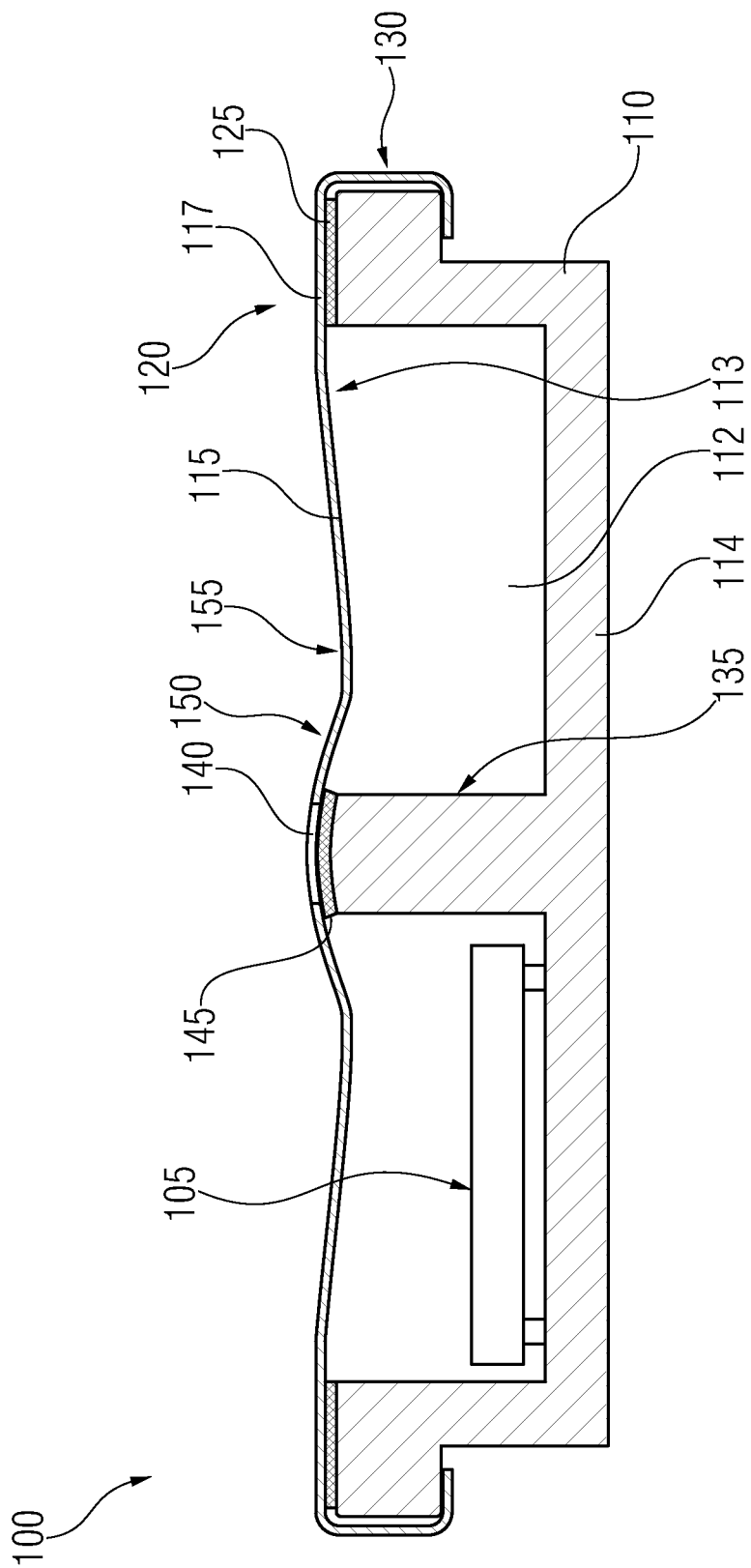
FIG. 1 is a diagrammatic, longitudinal sectional view through an enclosure according to a first embodiment of the invention.

Referring now to the figures of the drawings in detail and first, particularly to FIG. 1 thereof, there is shown an electronic control unit with an enclosure 100 in which a circuit board with electronic components 105 is received according to a first exemplary embodiment of the invention. The enclosure 100 may be adapted for use on board of a motor vehicle. The electronic control unit 105 may control a part of the motor vehicle.

The enclosure 100 contains a rigid housing element 110 and an elastic cover 115. The housing element 110 may be made from cast metal, die cast metal by preference. The metal may contain a light metal such as aluminium or an aluminium alloy. A cover 115 may be made from steel, especially from a flat sheet of steel. Expediently, it is composed from a shell part which is in particular made from cast metal and an electrical connector (not shown in the figures).

The housing element 110 is open on one side and the open side is closed by the cover 115. More specifically, the housing element 110 defines a cavity 112 which extends from an opening 113 at the open side into the housing element 110, in particular to a bottom plate 114 of the housing element 110. The cover 115 covers the opening 113 in top view on the latter.

In some embodiments there are provided one or more additional feed-throughs in the housing element, especially for guiding through an electrical cable. The cable may be sealed against the feed through in the housing element by a sealant or the cable may be sealed against another cover that is then sealed against the feed-through. However, the open side mentioned above which is to be sealed by the cover 115 is generally wide enough for inserting the circuit board with the electronic components 105 into the housing element 110. The opening 113 is preferred to extend over one complete side of the housing element 110 as this eases manufacturing of the housing element 110, especially by casting, but other solutions in which the opening 113 covers only part of one side of the housing element 110 are also possible.

A sealing rim 117 of the cover 115 may be directly in contact with the housing element 110 in an area 120 where the cover 115 mates with the housing element 110. However, in the option shown in FIG. 1, a seal 125, e.g. of elastic sealing material, lies between the housing element 110 and the cover 115. The area 120 is preferred to form a closed loop around the aperture and may or may not lie in one plane. The seal 125 may come as a gasket or it may comprise a liquid or otherwise dispensable substance for sealing the cover 115 against the housing element 110.

The cover 115 may be fixed to the housing element 110 by a fastening device 130. In the embodiment shown in FIG. 1, the fastening device 130 is represented by at least one clamp portion comprised by the cover 115 being bent around a lateral rim of the housing element 110. The fastening device 130 may also be a separate part or a plurality of separate parts. The fastening device 130 may for instance comprise an element that is kept on the housing element 110 by a series of bolts, screws or rivets. The fastening element 130 is preferred to press the cover 115 against the housing element 110 with a predetermined force. It is also preferred that the fastening element 130 is located near the area 120 where the cover 115 mates with the housing element 110.

A protrusion element 135 is affixed to the housing element 110 or, as in the present embodiment, comprised by the housing element 110. In the shown example, the protrusion element 135 is integrated with the housing element 110 in one piece. It may be in the shape of a post protruding from the bottom plate 114 towards the opening 113 through the cavity 112. It may or may not project beyond the lateral rim of the housing element 110. One end of the protrusion element 135 is preferred to lie roughly in the same height as the area 120.

The cover 115 abuts the end of the protrusion element 135 with a predetermined force when barometric pressures on different sides of the cover 115 are equal. The predetermined force is by preference generated by an elastic deformation of the cover 115 due to the protrusion element 135, for instance because the cover 115 is flat and the end of the protrusion element 135 lies higher than above-described area 120. Where the cover 115 rests against the end of the protrusion element 135, an aperture 140 extends through the cover 115. The aperture 140 may comprise one hole with a predetermined cross section or a plurality of holes of correspondingly smaller cross sections. The small holes may act as a filter to prevent dust or debris from entering the enclosure 100. It is preferred that the protrusion element 135 has an elastic sealing element 145 at its end abutting the cover 115. The protrusion element 135 and the cover 115 with the aperture 140 form a valve 150 of the unidirectional type, permitting a flow of air only from the cavity 112 to the outside of the enclosure 100.

When barometric pressures on the inside and the outside of the enclosure 100 are the same, the cover 115 is pressed down onto the protrusion element 135 with the predetermined force and the protrusion element 135 blocks the aperture 140. Therefore, no gas can be exchanged between the inside and the outside of the enclosure 100.

Considering a case where the barometric pressure on the outside of the enclosure 100 drops or the barometric pressure on the inside of the enclosure 100 rises, for instance because an enclosed volume of gas is heated when the electronic control unit is in operation, a positive pressure difference may be generated between the inside and the outside of the enclosure 100. The pressure difference lifts the cover 115 off the protrusion element 135 if the resulting force is large enough to exceed the predetermined force with which the cover 115 presses onto the protrusion element 135. This represents an opening of the valve 150 as the aperture 140 is no longer blocked by the protrusion element 135 and the barometric pressure inside the enclosure 100 is relieved towards the outside. This venting decreases the pressure inside the enclosure 100 so that eventually the predetermined force loading the cover 115 takes precedence and the valve 150 is closed.

Starting from equilibrium of barometric pressures inside and outside the enclosure 100, pressure inside the enclosure 100 may drop, for instance because the electronic control unit is deactivated and temperature inside the enclosure 100 drops. In this case, a negative difference between the inside pressure and the outside pressure of enclosure 100 is generated or increased. In effect, the pressure difference presses the cover 115 towards the inside of the enclosure 100, i.e. against the protrusion element 135 and against the housing element 110 or the seal 125 in the area 120. The pressing forces may cause the cover 115 to seal the housing element 130 only tighter. Positive air pressure outside the enclosure 100 is usually limited to weather caused pressures below 1600 hPa and pressure inside the enclosure 100 may not drop below zero so that effective forces on the cover 115 may be limited.

It is preferred that the cover 115 is convex—in particular dome-shaped—in the area of the aperture 140, seen from outside of the enclosure 100. In a configuration where the aperture 140 and the convex area 150 face upwards, gravity may ensure that fluid cannot cover the aperture 140 of the valve 150. This makes it less likely that a liquid or dust enters the enclosure 100.

The cover 115 may be convexly shaped during its production, especially by a stamping process. According to another embodiment, the convex shape of the cover 115 is a result of the elastic deformation of the cover 115 by the protrusion element 135 which ends further away from the bottom plate 114 of the housing element 110 than the area 120. In this case, the cover 115 may be stretched like a canvas on a one mast tent.

Stamping of the cover 115 may be done such that there is a depression 155 that surrounds the convex area 150 around the aperture 140. The depression 155 may on the one hand be adapted to repel moisture or dirt and on the other hand help the cover 115 to be elastically bent in a vertical direction around the aperture 140 more easily.

Figure 2:
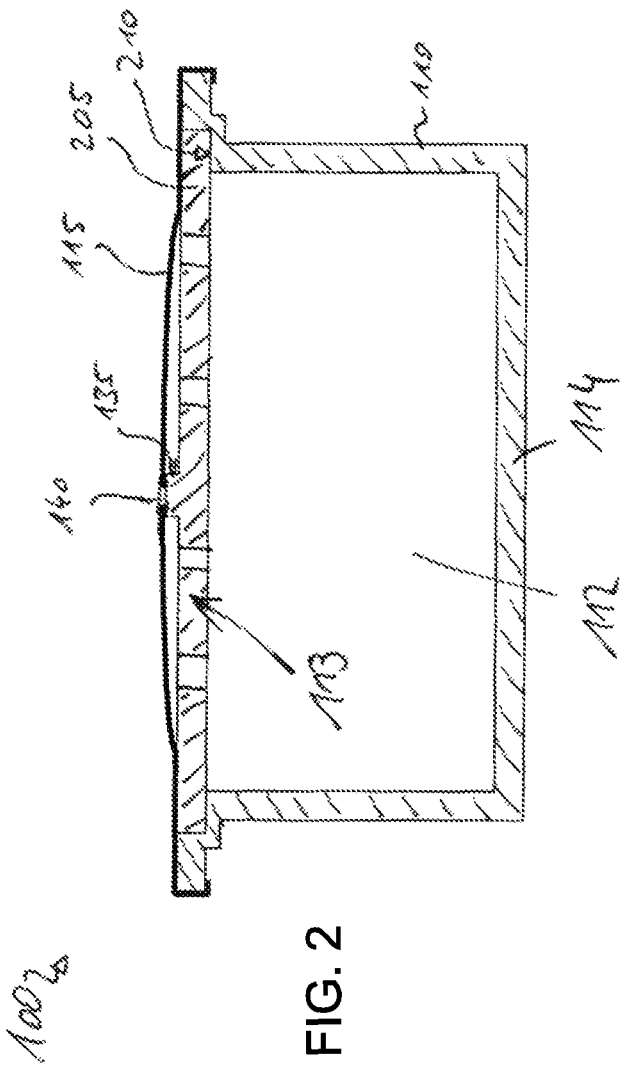
FIG. 2 is a diagrammatic, longitudinal sectional view through the enclosure according to a second embodiment.

FIG. 2 shows a longitudinal section through the enclosure 100 according to a second exemplary embodiment. In the second embodiment the protrusion element 135 does not traverse the interior of the enclosure 100—i.e. the cavity 112—vertically from the bottom plate 114 of the housing element 110 to the opening 113. This makes it easier to place a circuit board into the cavity 112. In the second embodiment a perforated lid 205 is provided that rests upon an upper rim 210 of the housing element 110 and 135 on its outer side. In this embodiment another seal between the lid 205 and the housing element 110 can be provided. The cover 115 is preferred to extend over the complete lid 205 and further over a rim portion of the housing element 110.

Figure 3:
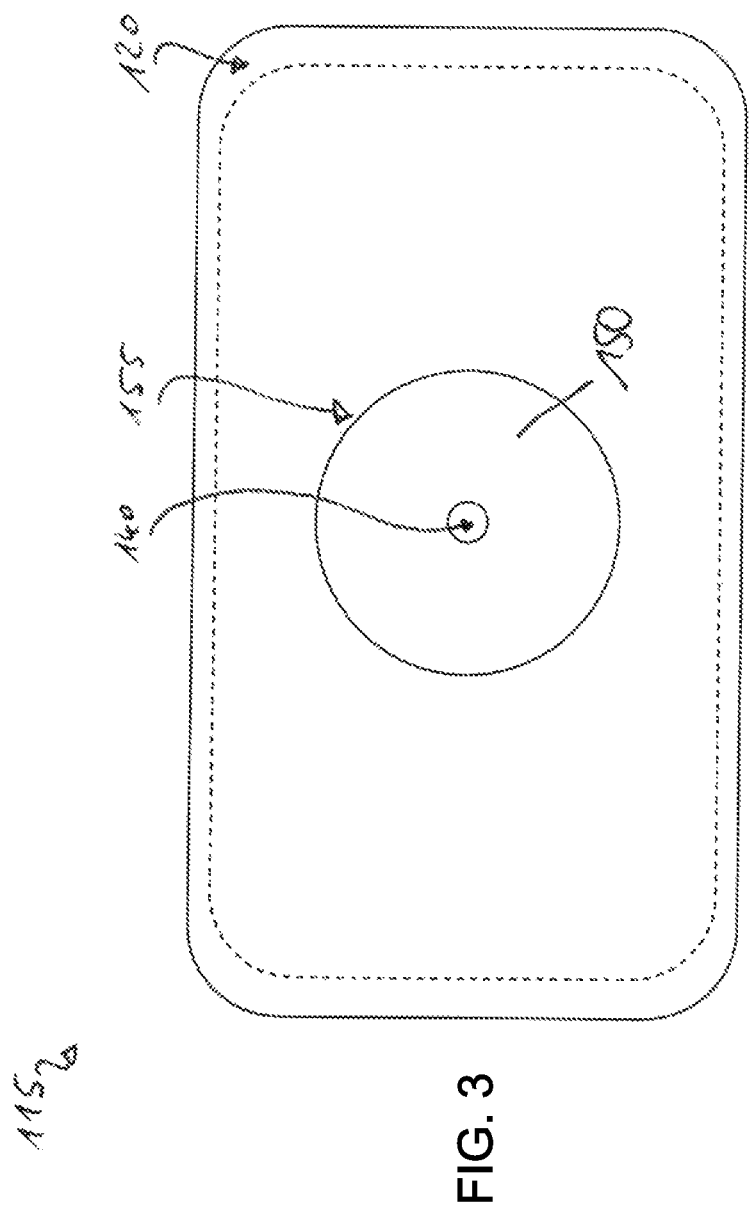
FIG. 3 is a plan view of a cover for the enclosure of FIG. 1 or FIG. 2.

FIG. 3 shows a plan view of the cover 115 for the enclosure 100 of FIG. 1 or FIG. 2 according to one exemplary embodiment. The optional depression 155 has a circular inner edge and runs circumferentially around a conical or dome-shaped convex section 150 containing the aperture 140. The Aperture 140 and depression 155 are preferred to be concentric. A position of the aperture 140 and therefore the protrusion element 135 with respect to the area 120—and thus the sealing rim 117—is preferred to be chosen such that a distance between the aperture 140 and the area 120 is no less than a predetermined distance in any direction. It is furthermore preferred that the distance between the aperture 140 and the area 120 is maximized in every direction. In the embodiment shown in FIG. 3 this corresponds to the aperture 140 being geometrically centred in the cover 115.

Vertical edges of the housing element 110 may be rounded so that the housing element 110 can better withstand a positive pressure difference between the outside and the inside. It can be seen that corners of the cover 115 may be rounded in correspondence. Other edges of the housing element 110 may also be rounded.

Figure 4:
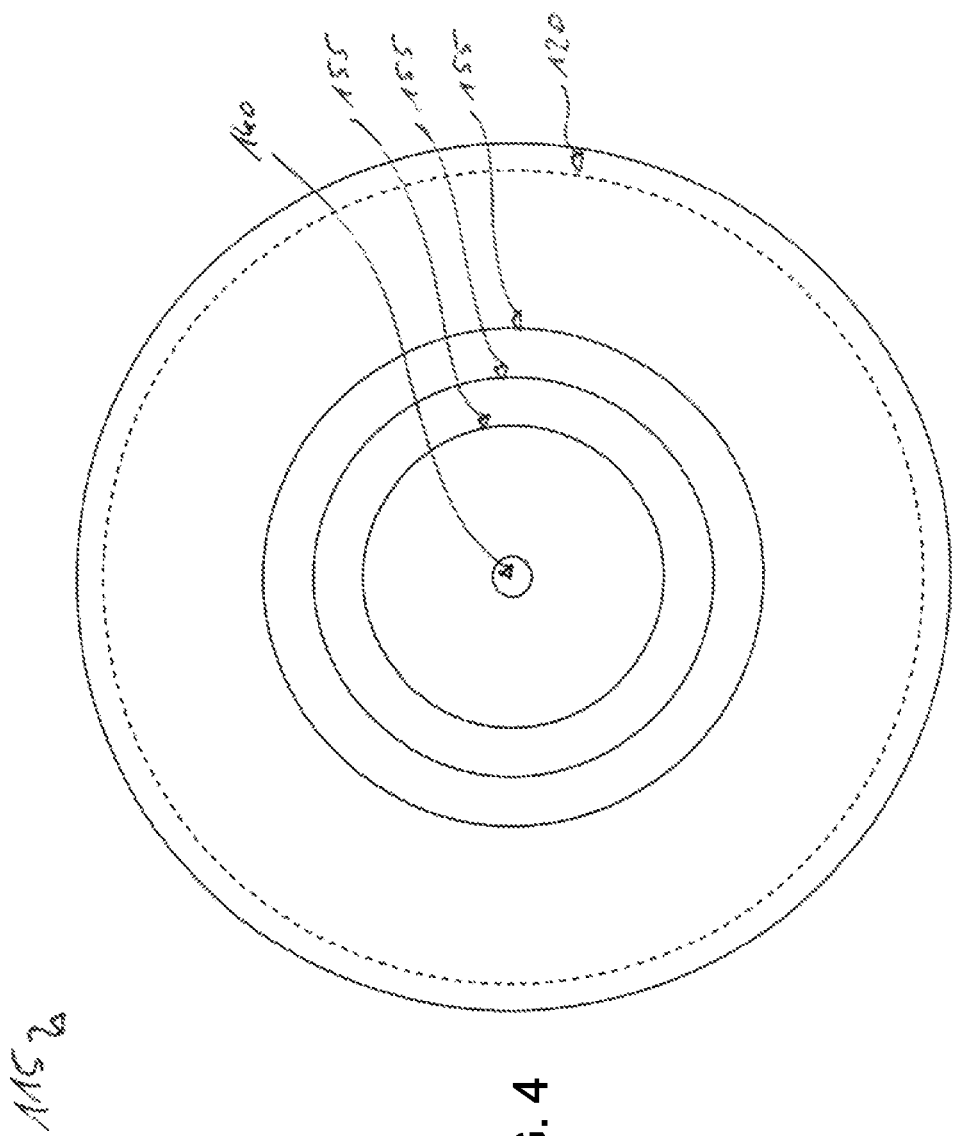
FIG. 4 is a plan view of second embodiment of the cover for the enclosure of FIG. 1 or 2.

FIG. 4 shows a plan view of a second embodiment of the cover 115 for the enclosure 100 of FIG. 1 or 2. In this embodiment, the housing element 110 or at least the opening 113 has a circular footprint. The cover 115 reflects that shape. Independent from the shape of the footprint of the cover 115 a concentric series of depressions 155 around aperture 140 may be manufactured into the cover 115. The cover 115 may especially be shaped through a stamping process. The concentric arrangement of more than one depression 155 may reduce a spring rate of the cover 115 when moved in a vertical direction in the area around the aperture 140. Venting the enclosure 100 as described above with reference to FIG. 1 may thus require only a small difference in pressures inside and outside the enclosure 100.

The invention is not limited to specific embodiments by the description on the basis of said exemplary embodiments but comprises any combination of elements of different embodiments. Moreover, the invention contains any combination of claims and any combination of features disclosed by the claims.

The invention claimed is:

1. An enclosure for an electronic control unit, the enclosure comprising:
   a rigid housing element for receiving electronic components of the electronic control unit, said rigid housing element being open on one side;
   an elastic cover covering said open side of said rigid housing element;
   a protrusion element attached to or comprised by said rigid housing element, wherein said cover abuts said protrusion element with a predetermined force when barometric pressures on different sides of said cover are equal; and
   said cover having an aperture formed therein in a region where said cover abuts said protrusion element;
   said cover and said protrusion element forming a valve being repeatedly movable between a closed position in which said cover abuts said protrusion element to seal said aperture and an open position in which said cover is moved away from said protrusion element to uncover said aperture.

2. The enclosure according to claim 1, wherein said cover is deflectable by means of an overpressure in an interior of the enclosure to lift off from said protrusion element for unsealing said aperture in said open position of said valve.

3. The enclosure according to claim 1, wherein the predetermined force is chosen such that a predetermined lift of said cover in an area of said aperture causes said cover to deform non-plastically.

4. The enclosure according to claim 1, wherein said protrusion element contains an elastic sealing element which abuts said cover for sealing said aperture.

5. The enclosure according to claim 1, wherein said aperture is spaced apart from an area where said cover mates with said rigid housing element by no less than a predetermined distance.

6. The enclosure according to claim 1 wherein said aperture is disposed in a central position, a distance of said central position to an area where said cover mates with said rigid housing element is maximized in all directions.

7. The enclosure according to claim 1, further comprising a fastening device for fixing said cover to said rigid housing element.

8. The enclosure according to claim 1, wherein said cover is stamped in an area around said aperture such as to increase an elastic deformability in an area of said aperture.

9. The enclosure according to claim 1, wherein said cover is formed such that said aperture lies further outwards from said rigid housing element than an area where said cover mates with said rigid housing element.

10. The enclosure according to claim 1, wherein said cover has a convex shape in an area of said aperture.

11. The enclosure according to claim 9 wherein said cover contains a depression surrounding said aperture.

12. The enclosure according to claim 1, wherein the enclosure is a housing of a vehicular electronic control unit.

13. An electronic control unit, comprising:
   an enclosure containing a rigid housing element being open on one side, an elastic cover covering said open side of said rigid housing element, a protrusion element attached to or comprised by said rigid housing element, wherein said cover abuts said protrusion element with a predetermined force when barometric pressures on different sides of said cover are equal, and said cover having an aperture formed therein in a region where said cover abuts said protrusion element; and
   a circuit board with electronic components received in said rigid housing element;
   said cover and said protrusion element forming a valve being repeatedly movable between a closed position in which said cover abuts said protrusion element to seal said aperture and an open position in which said cover is moved away from said protrusion element to uncover said aperture.

* * * * *